United States Patent [19]

Shin

[11] Patent Number: 5,523,187
[45] Date of Patent: Jun. 4, 1996

[54] METHOD FOR THE FABRICATION OF LIQUID CRYSTAL DISPLAY DEVICE

[75] Inventor: Woo S. Shin, Kyungki-do, Rep. of Korea

[73] Assignee: Goldstar Co., Ltd., Rep. of Korea

[21] Appl. No.: 359,919

[22] Filed: Dec. 20, 1994

[51] Int. Cl.⁶ ................................................ C09K 19/00
[52] U.S. Cl. ................................................ 430/20
[58] Field of Search ................................................ 430/20

[56] References Cited

U.S. PATENT DOCUMENTS 5,460,922  10/1995  Swirbel et al. .......................... 430/20

FOREIGN PATENT DOCUMENTS 61-290424  12/1986  Japan ........................................ 430/20
61-292614  12/1986  Japan ........................................ 430/20
62-276526  12/1987  Japan ........................................ 430/20

*Primary Examiner*—Charles L. Bowers, Jr.
*Assistant Examiner*—J. Pasterczyk
*Attorney, Agent, or Firm*—Ostrolenk, Faber, Gerb & Soffen

[57] ABSTRACT

A method for the fabrication of a liquid crystal display device consisting of a plurality of gates lines and a plurality of data lines and a thin film transistor at each intersection area of gate and data lines includes the steps of: forming a gate electrode and an oxide film on a glass substrate; depositing a gate insulation layer, an active layer and an impurity-doped layer, in sequence; taking off the gate insulation layer at an area connected with an anodized oxide line and then cleaving the gate electrode at the area connected with the anodized oxide line; forming a transparent electrode and then forming a source/drain electrode. An area of the gate electrode which is connected with the anodized oxide line is cleaved for testing, in advance of forming the transparent electrode by a chemical etchant. Accordingly, the chemical etchant used for forming the transparent electrode does not come into direct contact with the gate electrode, preventing damage to the gate electrode.

1 Claim, 4 Drawing Sheets

METHOD FOR THE FABRICATION OF LIQUID CRYSTAL DISPLAY DEVICE

BACKGROUND OF THE INVENTION

1. Field of the Invention

The present invention relates, in general, to a method for the fabrication of liquid crystal display device and, more particularly, to a method for the fabrication of a liquid crystal display device which is preventive of damage to a gate electrode of the liquid crystal display device by a chemical etchant.

2. Description of the Prior Art

In order to better understand the background of the present invention, a description will be made of a conventional fabrication method of a liquid crystal display device, in conjunction with FIGS. 1 through 4.

First, referring to FIG. 1, there is shown a pattern of a gate employed in a conventional thin film transistor. As shown in this figure, the conventional liquid crystal display device comprises a glass substrate 1 on which a gate metallization 10, a gate pad 20 and a gate line 25 are formed in their own patterns with the gate metallization having an electrical connection with the gate line 25 through the gate pad 20. In FIG. 1, the numeral 30 designates a display region.

After fabrication of the liquid crystal display shown in FIG. 1, it is necessary to cleave an area A of FIG. 1, which is connected with an anodized oxide line, for testing the liquid crystal display device. Generally, the area A is formed in the same manner as that employed for fabricating the liquid crystal display device and thus, at same time.

Referring now to FIGS. 2 and 3, there are illustrated a conventional process for fabricating a liquid crystal display device and a process for cleaving an area connected with an anodized oxide line, respectively.

Firstly, as shown in FIG. 2A and FIG. 3A, aluminum or aluminum-tantalum is deposited under vacuum at a predetermined thickness on a glass substrate 1 using a sputtering process and is then subjected to photolithography to form a gate electrode 2.

Secondly, as shown in FIG. 2B and FIG. 3B, the gate electrode 2 atop the glass substrate 1 is immersed in an electrolytic solution and subjected to an electric field, to form an oxide layer 3 which results from reaction of a portion of the gate electrode 2 with the electrolytic solution.

Thirdly, as shown in FIG. 2C and FIG. 3C, an insulation material, such as $SiN_x$ or $SiO_x$, is deposited on the oxide layer 3 by a chemical vapor deposition process, to form a gate insulation film 4, followed by sequential formation of an active layer 5 and an impurity-doped layer 6. For the active layer 5, amorphous silicon (a-Si:H) is deposited on the gate insulation layer 4 by a plasma enhancement chemical vapor deposition process. For the impurity-doped layer 6, amorphous silicon doped with high density impurities ($n^+$-a-Si:H) is deposited, in the same process.

Subsequently, in case of the fabrication process of liquid crystal display device, the impurity-doped layer 6 is patterned, as shown in FIG. 2D. On the other hand, in case of the cleavage process, the impurity-doped layer 6 and the active layer 5 were in sequence selectively removed, as shown in FIG. 3D.

In the cleaving process, a pad process is undertaken to form a lead line for wire-bonding as well as to remove the gate insulation layer 4 selectively. As a result, the gate insulation layer 4 is removed at the area with which an anodized oxide line is connected, and a pattern of photoresist and a PR is formed, as shown in FIGS. 3E and 3F.

Thereafter, as shown in FIG. 2E and FIG. 3G, indium tin oxide (hereinafter referred to as "ITO") is deposited on the resulting structure and then etched by a chemical etchant, to form a transparent electrode 7.

Next, as shown in FIG. 2F and FIG. 3H, aluminum is deposited under a vacuum over the transparent electrode 7 in a sputtering process and then subjected to photolithography, to form a source/drain electrode 8.

A cleaving testing process step is undertaken to separate the gate electrode 2 at an area connected with the anodized oxide line, as shown in FIG. 3I.

However, a serious problem may arise prior to cleaving the gate electrode 2 at the connected area when using the conventional method. With reference to FIGS. 4A and 4B, there is shown a damage region 2a of the gate electrode caused by the chemical etchant. As shown in these figures, the gate electrode 2 may come into contact with the chemical etchant prior to being cleaved. That is, the gate may be etched by the chemical etchant when the transparent electrode 7 is formed by the wet etch process. Since the gate electrode 2 is made of aluminum or aluminum-tantalum, which is rapidly etched, it is easily damaged by the chemical etchant.

SUMMARY OF THE INVENTION

Therefore, an object of the present invention is to overcome the above problems encountered in the prior art and to provide a method for the fabrication of a liquid crystal display device which is preventive of damage to a gate electrode of the liquid crystal display device by a chemical etchant.

In accordance with the present invention, the above object may be accomplished by a provision of the method for the fabrication of a liquid crystal display device, comprising the steps of: forming a gate electrode and an oxide film on a glass substrate; depositing a gate insulation layer, an active layer and an impurity-doped layer, in sequence; selectively removing the gate insulation layer at an area connected with an anodized oxide line and then, cleaving the gate electrode at an area connected with the anodized oxide line; forming a transparent electrode and then, forming a source/drain electrode.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENTS

Figure 1:
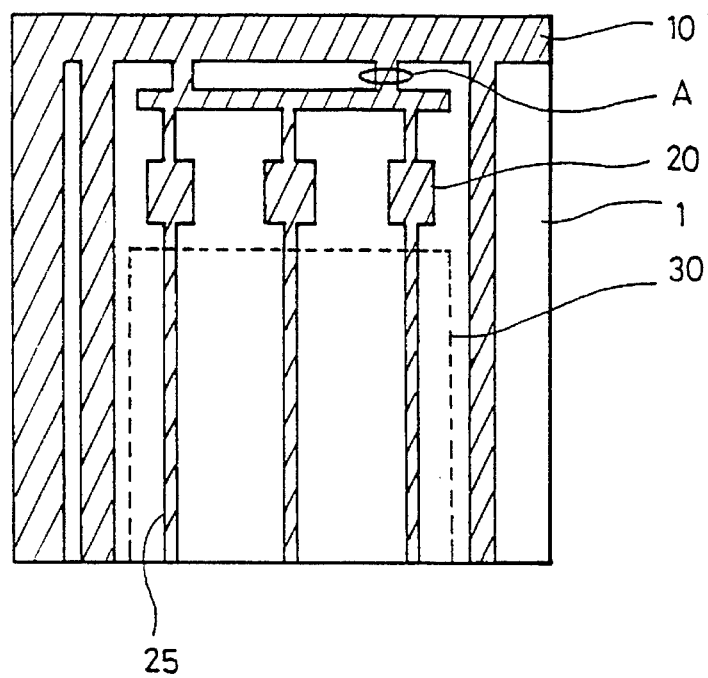
FIG. 1 is a schematic view showing a pattern of a gate in a general liquid crystal display device.
Figure 4A:
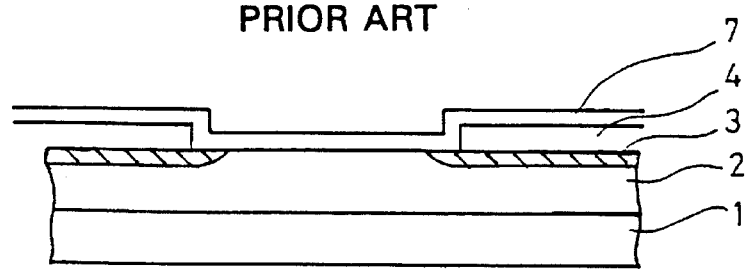
FIG. 4A is a schematic cross sectional view showing the deposition state of a transparent electrode in FIG. 3.
Figure 4B:
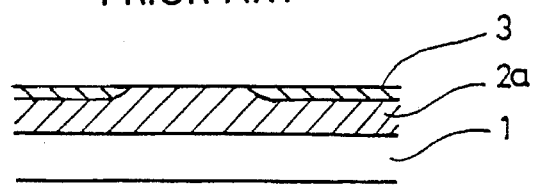
FIG. 4B is a schematic cross sectional view showing damage caused to a gate electrode by a chemical etchant.

The application of the preferred embodiments of the present invention is best understood with reference to the accompanying drawings, wherein like reference numerals are used for like and corresponding parts, respectively.

It should be noted that a liquid crystal display device is fabricated by the same processes as those illustrated in FIG. 2, as the area connected with an anodized oxide line is formed.

FIG. 5 shows the preferred process steps of cleaving the area connected with the anodized oxide line in a liquid crystal display device. These steps will be in detail described in connection with FIGS. 5A through 5I.

Figure 5A:
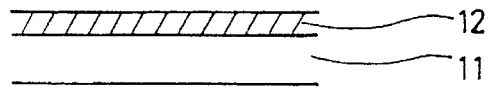
FIGS. 5A through 5I are schematic cross-sectional views illustrating process steps for cleaving an area of a gate electrode connected with an anodized oxide line, according to the present invention.

First, as shown in FIG. 5A, aluminum or aluminum-tantalum is deposited in vacuo at a predetermined thickness on a glass substrate 11 using a sputtering process and then subjected to photolithography, to form a gate electrode 12.

Figure 5B:
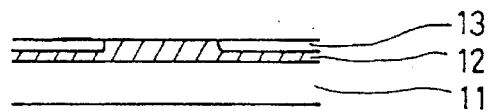

Second, with reference to FIG. 5B, the gate electrode 12 atop the glass substrate 11 is immersed in an electrolytic solution and applied with an electric field, to form an oxide layer 13 which results from reaction of a portion of the gate electrode 12 with the electrolytic solution.

Figure 5C:
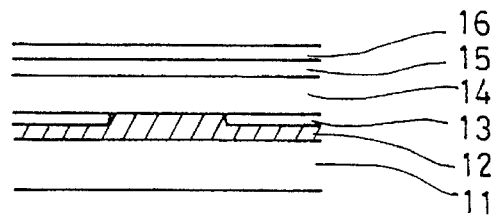

Third, with reference to FIG. 5C, an insulation material, such as $SiN_x$ or $SiO_x$, is deposited on the oxide layer 13 by a chemical vapor deposition process formed a gate insulation layer 14, followed the sequential formation of an active layer 15 and an impurity-doped layer 16. For the active layer 15, amorphous silicon (a-Si:H) is deposited on a gate insulation layer 14 by a plasma enhancement chemical vapor deposition process. For the impurity-doped layer 16, amorphous silicon doped with high density impurities ($n^+$-a-Si:H) is deposited, by the same process.

Figure 5D:
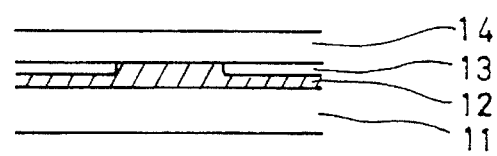

Subsequently, with reference to FIG. 5D, the impurity-doped layer 16 and the active layer 15 used to fabricate the source and drain regions were in sequence selectively removed, as shown in FIG. 5D, in the gate region.

Figure 5E:
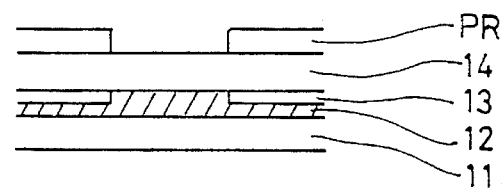

A pad process is undertaken to form a pattern of photoresist PR on a predetermined area of the gate insulation layer 14, as shown in FIG. 5E.

Figure 5F:
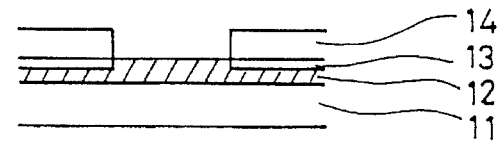

Using the photoresist PR as a mask, the gate insulation layer 14 is selectively taken off, so as to remove an area with which an anodized oxide line is connected, as shown in FIG. 5F.

Figure 5G:
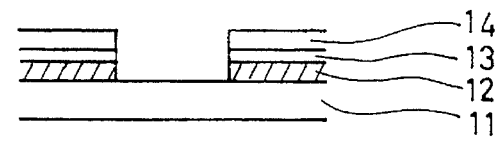

Thereafter, with reference to FIG. 5G, the gate electrode 12 is cleaved at an area with which the anodized oxide line is connected, with the aim of testing the connected area.

Figure 2A:
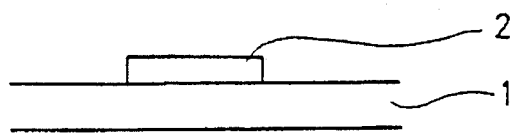
FIGS. 2A through 2F are schematic cross sectional views illustrating general process steps for fabricating a liquid crystal display device.
Figure 2B:
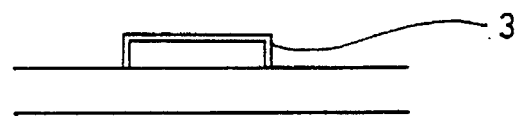
Figure 2C:
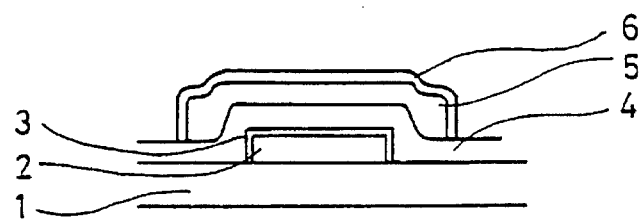
Figure 2D:
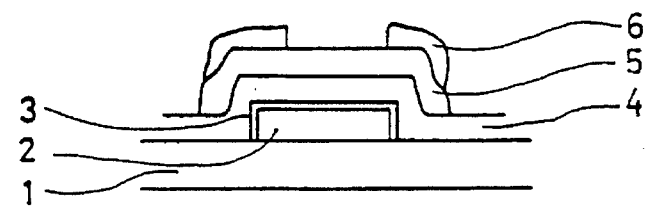
Figure 2E:
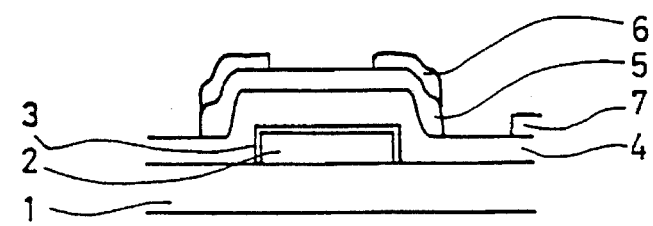
Figure 2F:
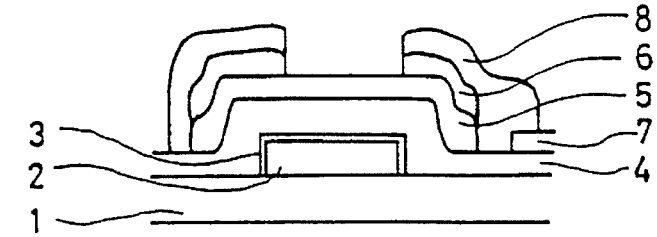
Figure 3A:
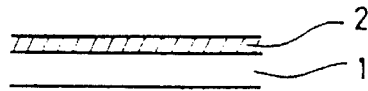
FIGS. 3A through 3I are schematic cross sectional views illustrating conventional process steps for cleaving an area of a gate electrode connected with an anodized oxide line.
Figure 3B:
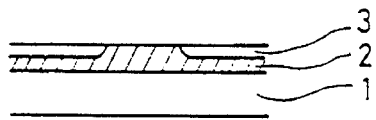
Figure 3C:
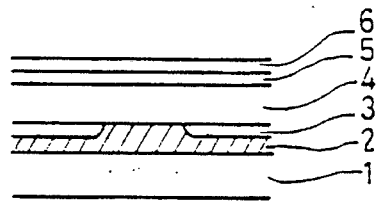
Figure 3D:
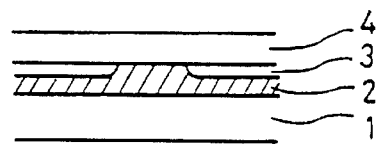
Figure 3E:
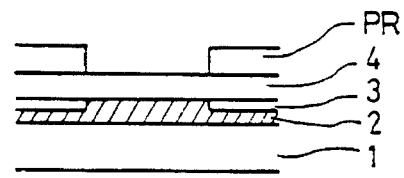
Figure 3F:
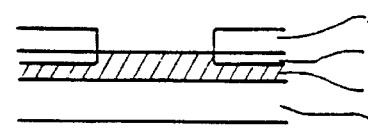
Figure 3G:
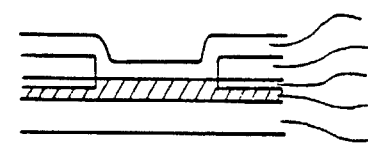
Figure 3H:
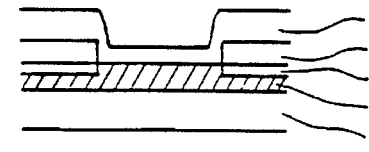
Figure 3I:
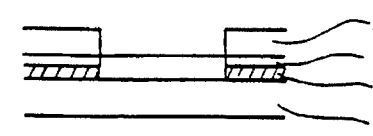
Figure 5H:
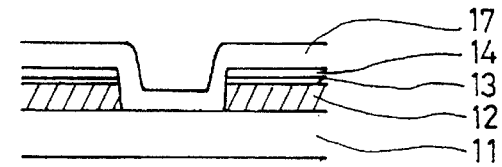

Next, with reference to FIG. 5H ITO is coated on the resulting structure including the gate electrode 12 and then, etched by a chemical etchant, to form a transparent electrode 17. The chemical etchant does not come into direct contact with the gate electrode 12, as the gate electrode 12 is covered with the ITO film. In the meanwhile, a transparent electrode is formed in an area connected with the anodized oxide line in the same manner as illustrated in FIG. 2E.

Aluminum is deposited in vacuo over the transparent electrode 17 by a sputtering process, as shown in FIG. 5H.

Figure 5I:
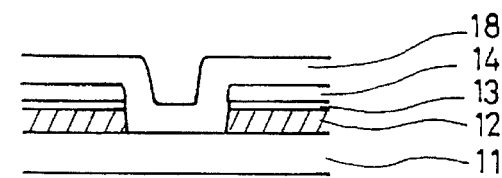

Finally, with reference to FIG. 5I, the deposited aluminum is subjected to photolithography to form a source/drain electrode 18.

In accordance with the method of the present invention, as described hereinbefore, the step of cleaving the area connected with the anodized oxide line for testing is undertaken in advance of forming the transparent electrode by chemical etching, in order not to bring the chemical etchant used for forming the transparent electrode into direct contact with the gate electrode, thereby preventing damage to the gate electrode.

Other features, advantages and embodiments of the invention disclosed herein will be readily apparent to those exercising ordinary skill after reading the foregoing disclosure. In this regard, while a specific embodiment of the invention has been described in considerable detail, variations and modifications can be effected without departing from the spirit and scope of the invention as described and claimed.

What is claimed is:

1. A method for fabricating a liquid crystal display device including a plurality of gate lines and a plurality of data lines, and a thin film transistor at each intersection area of the gate the data lines, the improvement comprising the steps of:

forming a gate electrode on a glass substrate;

forming an oxide film on the gate electrode;

depositing a gate insulation layer, an active layer and an impurity-doped layer on the oxide film, in sequence;

selectively removing the active layer and the impurity-doped layer;

selectively removing the gate insulation layer at an area connected with an anodized oxide line, using a photoresist as a mask;

cleaving the gate electrode at the area connected with the anodized oxide line;

after performing the cleaving step, forming a transparent electrode over a structure resulting from the previous steps by depositing a transparent electrode material thereon and etching the transparent electrode; and thereafter, forming a source/drain electrode over the resulting structure.

\* \* \* \* \*